US006992510B2

(12) United States Patent
Wagner

(10) Patent No.: US 6,992,510 B2
(45) Date of Patent: Jan. 31, 2006

(54) MULTIPLIER CIRCUIT WITH OFFSET COMPENSATION AND QUADRICORRELATOR

(75) Inventor: Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 870 days.

(21) Appl. No.: 09/917,557

(22) Filed: Jul. 27, 2001

(65) Prior Publication Data

US 2002/0019221 A1 Feb. 14, 2002

(30) Foreign Application Priority Data

Jul. 27, 2000 (DE) ................................ 100 36 735

(51) Int. Cl.
*H03B 21/00* (2006.01)
*H03B 19/00* (2006.01)
*G06F 7/44* (2006.01)

(52) U.S. Cl. ........................ 327/107; 327/113; 327/356

(58) Field of Classification Search ................ 455/326; 375/77, 233, 316; 327/107, 113, 356
See application file for complete search history.

(56) References Cited

U.S. PATENT DOCUMENTS 3,746,851 A * 7/1973 Gilbert ........................ 708/836
3,751,994 A * 8/1973 Gross .......................... 73/662
3,831,014 A 8/1974 Haid
3,867,620 A 2/1975 Coor
4,470,145 A 9/1984 Williams
4,500,973 A * 2/1985 Ley ............................... 708/7
4,755,761 A * 7/1988 Ray, Jr. ...................... 329/323
5,115,454 A * 5/1992 Kucar ........................ 375/321
5,790,597 A * 8/1998 Kurokami et al. .......... 375/233
6,493,404 B1 * 12/2002 Iizuka et al. ................ 375/343
6,738,433 B1 * 5/2004 Van Waasen et al. ....... 375/316

OTHER PUBLICATIONS

Floyd M. Gardner: "Properties of Frequency Difference Detectors", IEEE Trans. Comm. vol. COM-33, pp. 131-138, Feb. 1985.

* cited by examiner

*Primary Examiner*—Ahmad F. Matar
*Assistant Examiner*—Hector A. Agdeppa
(74) *Attorney, Agent, or Firm*—Laurence A. Greenberg; Werner H. Stemer; Ralph E. Locher

(57) ABSTRACT

A multiplier circuit has an analog multiplier with two signal inputs. A respective switching device is connected to each one of the two signal inputs of the analog multiplier for periodically reversing the polarity of the input voltages. A clock signal that can be fed to the switching devices has a changeover frequency that is preferably greater than or equal to twice the useful signal frequency. This suppresses offset-governed crosstalk of the input signals to the output of the analog multiplier. This principle can also be employed in quadricorrelators.

8 Claims, 2 Drawing Sheets

MULTIPLIER CIRCUIT WITH OFFSET COMPENSATION AND QUADRICORRELATOR

BACKGROUND OF THE INVENTION

Field of the Invention

The invention relates to a multiplier circuit with offset compensation and to a quadricorrelator having such multiplier circuits.

Quadricorrelators can be used for the demodulation of frequency-modulated signals in mobile radio receivers. GFSK modulation (Gaussian frequency shift keying) is used in the DECT (digital enhanced cordless telecommunication) standard, in the same way as in Bluetooth. The intermediate frequency may be zero or very low in mobile radio receivers which use the aforementioned standards.

So-called quadricorrelators can be used for converting the useful signal into a baseband signal with FM demodulators. A symmetrical quadricorrelator is shown in FIG. 3 of the paper "Properties of Frequency Difference Detectors" by Floyd M. Gardner, IEEE Transactions on Communications, volume COM-33, pages 131 to 138, February 1985. In this case, analog multipliers are in each case provided in the I path and in the Q path, a phase shifting network is connected upstream of the analog multipliers, and the outputs of the analog multipliers are connected in a differential node.

What is problematic in quadricorrelators is that the analog multipliers usually have DC voltage offsets which result in crosstalk of the input signal of the demodulator to the output. As a result of this, an interference signal is superposed on the useful signal and leads to problems particularly during the subsequent digital processing of the useful signal in baseband modules.

It is known to reduce the DC voltage offsets of the analog multipliers by enlarging the chip area. By virtue of the consequently improved matching in the analog multipliers, although the bit error rate during further processing of the useful signal is reduced, the enlarged chip area requirement is nonetheless disadvantageous in particular to the extent that, in mobile radio applications, particular importance is usually attached to structural size, weight and reduction of costs.

In order to suppress DC voltage offsets in amplifiers, it is known for the polarity of both the input signal and the output signal of the amplifier to be periodically changed over (chopping). In this case, in accordance with the sampling theorem, the changeover frequency must be at least twice as high as the maximum useful frequency of the amplifier.

SUMMARY OF THE INVENTION

It is accordingly an object of the invention to provide a multiplier circuit with offset compensation and also a quadricorrelator having such multiplier circuits which overcomes the above-mentioned disadvantageous of the prior art apparatus of this general type. In particular, it is an object of the invention to provide a multiplier circuit with offset compensation and also a quadricorrelator having such multiplier circuits in which offset-governed crosstalk from input to output is reduced. It is also an object of the invention to provide such circuits that can be realized with a small chip area requirement and that are suitable for application in mobile radio receivers.

With the foregoing and other objects in view there is provided, in accordance with the invention, a multiplier circuit with offset compensation that has an analog multiplier including a first signal input for receiving a first signal, a second signal input for receiving a second signal, and an output for providing a multiplied signal. A first switching device is provided for polarity reversal. The first switching device is connected to the first signal input. A second switching device is provided for polarity reversal. The second switching device is connected to the second signal input.

A DC voltage offset of an analog multiplier is compensated by the switching devices or in other words by the changeover switches that reverse the polarity of the respective input voltages. The changeover switches are connected upstream of the two inputs of the analog multiplier. In this case, each of the input voltages can be simultaneously subjected to polarity reversal. If both input signals are fed in having undergone polarity reversal, then the minus sign is canceled out through product formation at the output. The polarity reversal can be effected periodically.

The two inputs can be connected to a common switching device or to two mutually separate switching devices.

The described configuration has the advantage that signals which can be fed in at the input of the analog multiplier do not effect crosstalk to the output of the analog multiplier. If a DC voltage offset remains at the output of the analog multiplier, then it can be suppressed in a simple manner since it can be treated like a frequency error. A further changeover switch is not necessary at the output of the analog multiplier as a result of eliminating the negative sign through the product formation.

In accordance with an added feature of the invention, a clock signal having a changeover frequency can be fed to the switching device. In this case, a respective switching device or a common switching device can be provided for the two signal inputs of the analog multiplier. The switching devices can be driven at the changeover frequency in such a way that each of the input signals which can be fed to the signal inputs are simultaneously subjected to polarity reversal.

In accordance with an additional feature of the invention, the changeover frequency is greater than or equal to twice the frequency of the signals which can be fed to the signal inputs. In accordance with the sampling theorem, the lowest sampling frequency at which the useful signal is still free from errors, that is to say at which the useful signal can be reconstructed without loss of information, is greater than or equal to twice the maximum useful signal frequency.

In accordance with another feature of the invention, the changeover frequency lies in a range between 4 times and 32 times the frequency of the signals which can be fed to the signal inputs.

In accordance with a further feature of the invention, the voltage at the output of the analog multiplier is the product of the voltages of the signals which can be fed to the signal inputs.

If the signals which can be fed to the signal inputs of the analog multiplier are present as differential signals, it may be advantageous that the signal inputs of the analog multiplier each have two terminals for feeding in the input signals present as differential signals.

If the input signals are present as differential signals, the polarity reversal in the switching devices may be configured particularly simply by virtue of the fact that, for the polarity reversal of the input signals, it is necessary only to reverse the polarity of the two lines carrying the differential signal.

With the foregoing and other objects in view there is also provided, in accordance with the invention, a quadricorrelator that includes a first signal path (I), a second signal path (Q), and a first analog multiplier that is located in the first signal path (I). The first analog multiplier includes an output and two inputs. A second analog multiplier is provided and is located in the second signal path (Q). The second analog multiplier includes an output and two inputs. A differential node is connected to the output of the first analog multiplier and to the output of the second analog multiplier. A first switching device is provided for periodically reversing the polarity of a signal selected from the group consisting of a quadrature component of a signal and a signal derived from the quadrature component of the signal and for thereby providing a first quadrature component signal. The first switching device is connected to the two inputs of the first analog multiplier for supplying the first quadrature component signal thereto. A second switching device is provided for periodically reversing a polarity of a signal selected from the group consisting of another quadrature component of the signal and a signal derived from the other quadrature component of the signal and for thereby providing a second quadrature component signal. The second switching device is connected to the two inputs of the second analog multiplier for supplying the second quadrature component signal thereto.

The differential node may be a summing element to which the I path with positive sign and the Q path with negative sign can be fed.

As a result of this, in a quadricorrelator which can be used for frequency demodulation, crosstalk of the signals on the I and Q paths to the output signal of the quadricorrelator is prevented. Consequently, it is possible to realize subsequent digital processing of the useful signal, for example in a baseband module, with a bit error rate which is zero or minimal.

The present principle is not restricted to application in mixer or demodulator circuits, but rather can be correspondingly transferred to other applications by a person skilled in the art.

Other features which are considered as characteristic for the invention are set forth in the appended claims.

Although the invention is illustrated and described herein as embodied in a multiplier circuit with offset compensation and quadricorrelator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
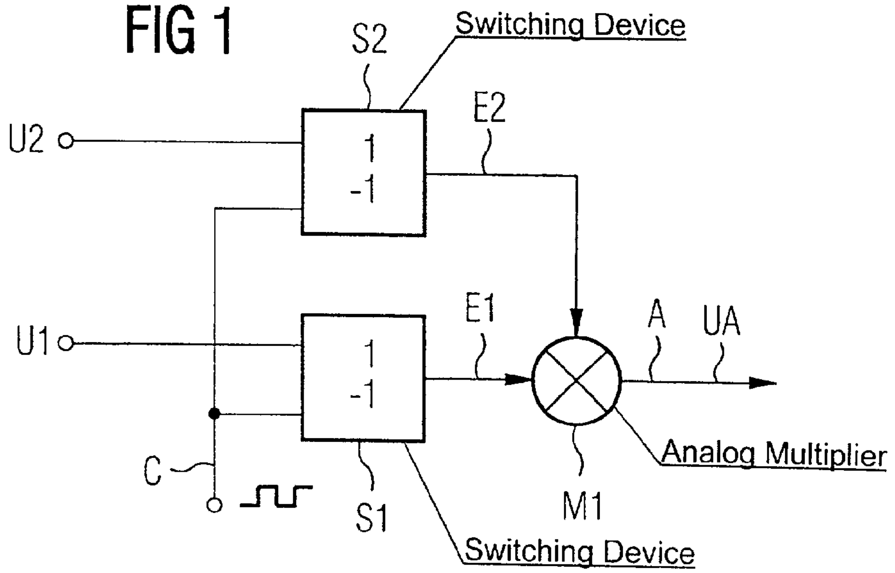
FIG. 1 is a block diagram showing an exemplary embodiment of a multiplier circuit.

Referring now to the figures of the drawing in detail and first, particularly, to FIG. 1 thereof, there is shown a multiplier circuit having an analog multiplier M1. The analog multiplier M1 has a first signal input E1, a second signal input E2 and an output A. A respective switching device S1, S2 is connected to the signal inputs E1, E2 of the analog multiplier M1.

The switching devices S1, S2, to which a clock signal C can be fed, serve for simultaneous, periodic polarity reversal of the voltages U1, U2 of the input signals E1, E2. The output voltage UA of the analog multiplier M1 corresponds to the multiplication of the voltages U1, U2 of the input signals E1, E2 in accordance with the formula $$UA=U1\cdot U2.$$

If the analog multiplier has a DC voltage offset $U_{O1}$, $U_{O2}$ between input and output, then the following holds true for the output voltage UA:

$$\begin{aligned} UA &= (U1+U_{01})*(U2+U_{02}) \\ &= U1*U2+U1*U_{02}+U2*U_{01}+U_{01}*U_{02} \end{aligned}$$

If both input voltages are subjected to polarity reversal, then the following holds true:

$$UA=(-U1)*(-U2)=U1*U2$$

If the changeover frequency $f_C$ of the clock signal C is assumed to be large relative to the frequency of the input signal, then the following holds true in accordance with the addition of the two switching states for averaging over a period of the clock signal C:

$$\begin{aligned} 2*UA &= (U1+U_{01})*(U2+U_{02})+(-U1+U_{01})*(-U2+U_{02}) \\ &= U1*U2+U1*U_{02}+U2*U_{01}+U_{01}*U_{02}+(-U1)* \\ &\quad (-U2)+(-U1)*U_{02}+(-U2) \\ &\quad *U_{01}+U_{01}*U_{02}=U1*U2+(-U1)*(-U2)+(U1-U1) \\ &\quad *U_{02}+(U2-U2) \\ &\quad *U_{01}+U_{01}*U_{02}+U_{01}*U_{02}=2*U1*U2+2*U_{01}*U_{02} \end{aligned}$$

or, combined and shortened, $$UA=U1*U2+U_{01}*U_2$$

Since the mixed terms disappear, signals which couple over from the input of the analog multiplier or mixer to the output are suppressed. The remaining, unadulterated DC voltage offset $U_{O1}*U_{O2}$ is unproblematic because it can be identified and suppressed like a frequency error.

Thus, with a low outlay on circuitry, a multiplier circuit is specified in which crosstalk of input signals to the output is suppressed. This multiplier circuit can be realized in a simple manner whilst requiring little chip area, for example in mobile radio applications.

Figure 2:
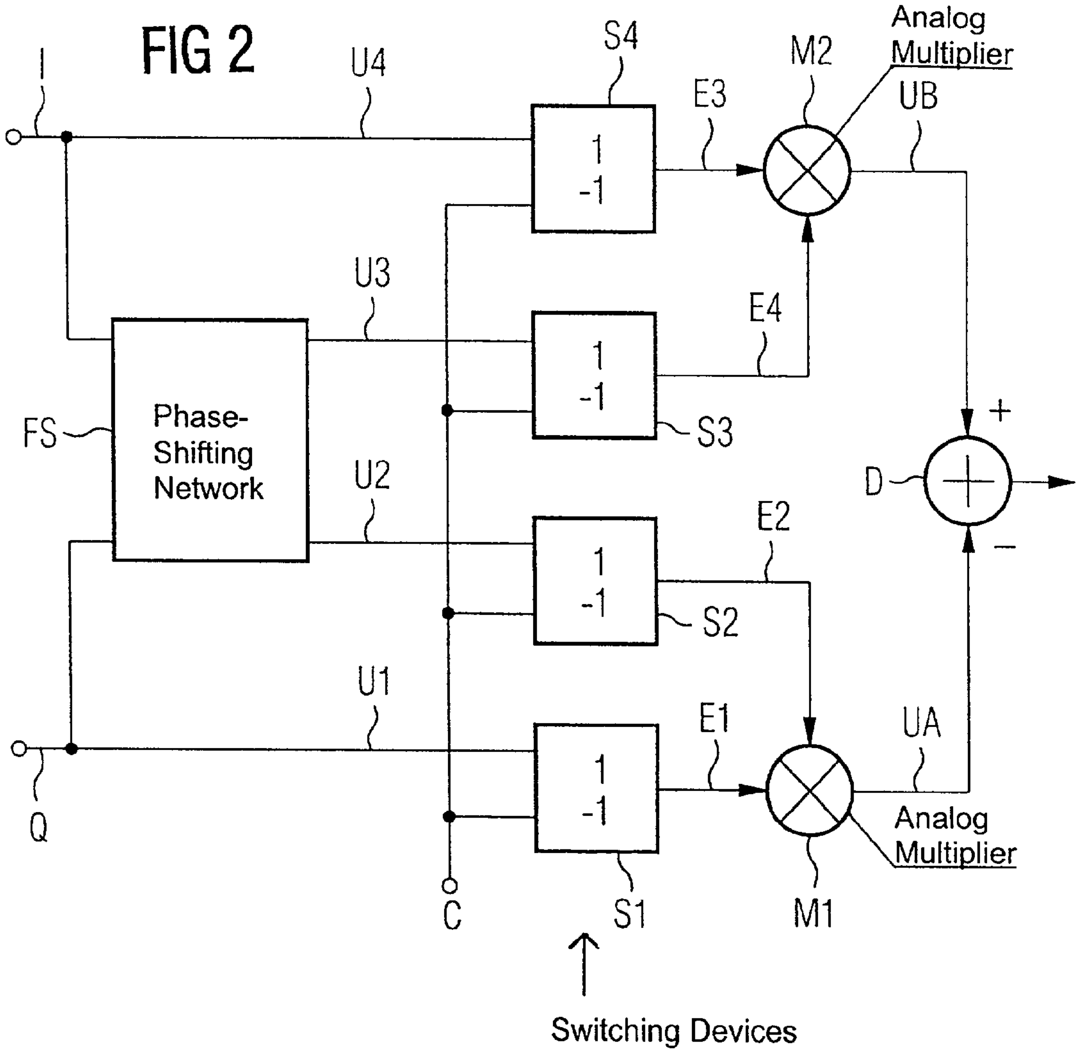
FIG. 2 shows a quadricorrelator that utilizes the multiplier circuit shown in FIG. 1.

FIG. 2 shows a symmetrical quadricorrelator having an I path and a Q path. The quadricorrelator is used for frequency demodulation. A respective analog multiplier M1, M2 is provided in the I path and in the Q path. The outputs of the analog multipliers M1, M2 are connected in a differential node for forming the difference between the output voltages UA, UB. By way of example, a baseband module for subsequent digital processing of the useful signal may be connected downstream of the difference-forming node D. The analog multipliers M1, M2 each have two inputs E1, E2 and E3, E4, respectively, to which a respective changeover or switching device S1, S2, S3, S4 is connected. A clock signal C can be fed to each of the changeover or switching devices S1, S2, S3, S4. Depending on the clock signal level, the voltage of the input signal U1, U2, U3, U4 is present in identical or inverted form at the outputs of the changeover or switching devices S1 to S4. Whereas the switching devices S1 and S4 are configured directly in the I path and in the Q path, the switching devices S2, S3 are connected to the I path and Q path indirectly via a phase shifting network FS.

Crosstalk of the input signals of the analog multipliers to their outputs or to the output of the quadricorrelator is effectively suppressed by respective simultaneous polarity reversal of the signal voltages U1, U2, U3, U4 of the input signals of the analog multipliers M1, M2. These input signals are present at the inputs E1 to E4 of the analog multipliers M1, M2. In this case, in accordance with the sampling theorem, the changeover frequency $f_C$ is at least twice as high as the maximum useful signal frequency that occurs. For a simple circuitry realization, the changeover frequency $f_C$ may, for example, lie in a range between 4 times and 32 times the useful signal frequency.

Figure 3:
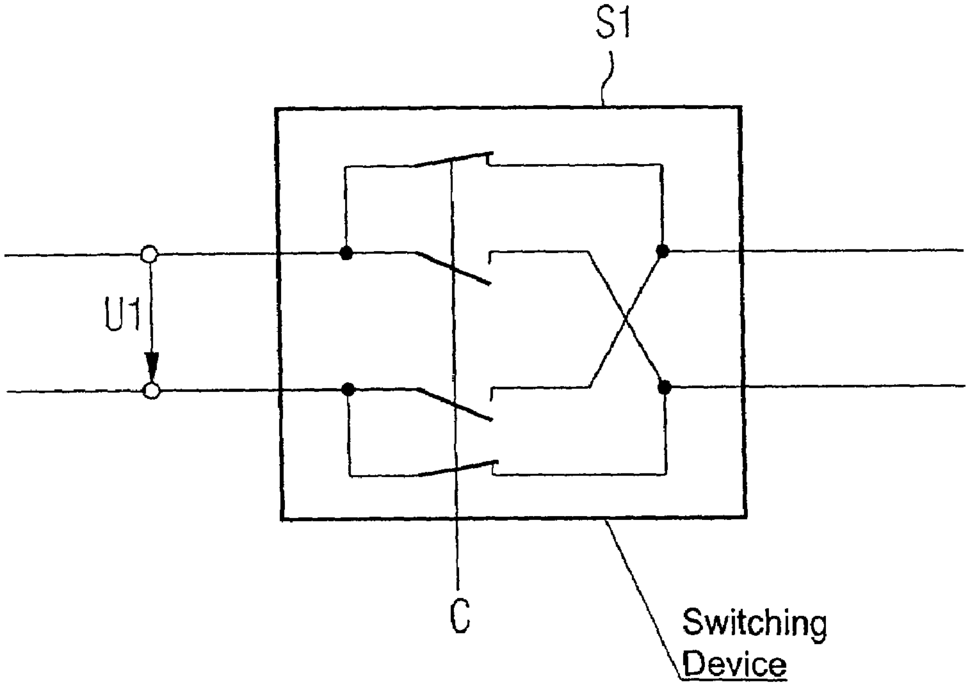
FIG. 3 shows a changeover device for use with differential signals.

If the signals which can be fed to the analog multipliers M1, M2 at their signal inputs E1 to E4 are present as differential signals, the polarity reversal of the input signals can be realized in a simple manner by means of a changeover or switching device M1 such as that shown in FIG. 3. This is because reversing the polarity or inverting the input signals merely requires the interchanging of the two lines carrying the differential signal. It goes without saying that the principle shown for the first switching device S1 can also be employed for the further switching devices S2 to S4.

I claim:

1. A multiplier circuit with offset compensation, comprising:

an analog multiplier including a first signal input for receiving a first signal, a second signal input for receiving a second signal, and an output for providing a multiplied signal;

a first switching device for polarity reversal, said first switching device connected to said first signal input; and a second switching device for polarity reversal, said second switching device connected to said second signal input.

2. The multiplier circuit according to claim 1, wherein:

said first switching device includes a first clock input for receiving a clock signal;

and said second switching device includes a second clock input for receiving a clock signal; and a clock signal having a changeover frequency is fed to said first clock input and said second clock input.

3. The multiplier circuit according to claim 2, wherein:

the first signal has a first frequency and the second signal has a second frequency; and said changeover frequency is not less than two times a frequency selected from the group consisting of the first frequency of the first signal and the second frequency of the second signal.

4. The multiplier circuit according to claim 3, wherein the changeover frequency lies in a range between 4 times and 32 times the largest frequency.

5. The multiplier circuit according to claim 1, wherein the multiplied signal is a voltage that represents a product of the first signal and the second signal.

6. The multiplier circuit according to claim 1, wherein:

the first signal is a first differential signal and the second signal is a second differential signal;

said first signal input includes two terminals each receiving the first differential signal; and said second signal input includes two terminals each receiving the second differential signal.

7. The multiplier circuit according to claim 6, wherein:

said first switching device includes a device for polarity reversal for reversing a polarity of the first input signal received by each of said two terminals of said first signal input; and said second switching device includes a device for polarity reversal for reversing a polarity of the second input signal received by each of said two terminals of said second signal input.

8. A quadricorrelator, comprising:

a first signal path;

a second signal path;

a first analog multiplier located in said first signal path, said first analog multiplier including an output and two inputs;

a second analog multiplier located in said second signal path, said second analog multiplier including an output and two inputs;

a differential node connected to said output of said first analog multiplier and to said output of said second analog multiplier;

a first switching device for periodically reversing a polarity of a signal selected from the group consisting of a quadrature component of a signal and a signal derived from the quadrature component of the signal and for thereby providing a first quadrature component signal, said first switching device connected to said two inputs of said first analog multiplier for supplying the first quadrature component signal thereto; and a second switching device for periodically reversing a polarity of a signal selected from the group consisting of another quadrature component of the signal and a signal derived from the other quadrature component of the signal and for thereby providing a second quadrature component signal, said second switching device connected to said two inputs of said second analog multiplier for supplying the second quadrature component signal thereto.

* * * * *